United States Patent [19]

Tamura et al.

[11] 4,233,509
[45] Nov. 11, 1980

[54] ION-ELECTRON ANALYZER

[75] Inventors: Hifumi Tamura, Hachioji; Tohru Ishitani, Sayama, both of Japan

[73] Assignee: Hitachi, Ltd., Japan

[21] Appl. No.: 8,258

[22] Filed: Feb. 1, 1979

[30] Foreign Application Priority Data

Feb. 3, 1978 [JP] Japan ................................ 53-10444

[51] Int. Cl.³ .......................................... G01M 23/00
[52] U.S. Cl. .................................... 250/306; 250/310; 250/492 R
[58] Field of Search .......... 250/309, 310, 306, 492 R, 250/492 A

[56] References Cited

U.S. PATENT DOCUMENTS

| 3,617,739 | 11/1971 | Liebl | 250/309 |
| 4,139,774 | 2/1979 | Katagiri | 250/310 |

OTHER PUBLICATIONS

"Design & Performance of an Electron Diffraction Camera" by J. E. Ruedy.

Primary Examiner—Harold A. Dixon
Attorney, Agent, or Firm—Craig & Antonelli

[57] ABSTRACT

An ion-electron analyzer consists of an ion microprobe analyzer and an electron diffractometer which are accommodated in a single housing, an ion gun extracts an electron beam and a negative ion beam simultaneously from the same source of charged particles and simultaneously bombards these beams onto a selected location on the surface of a specimen.

12 Claims, 1 Drawing Figure

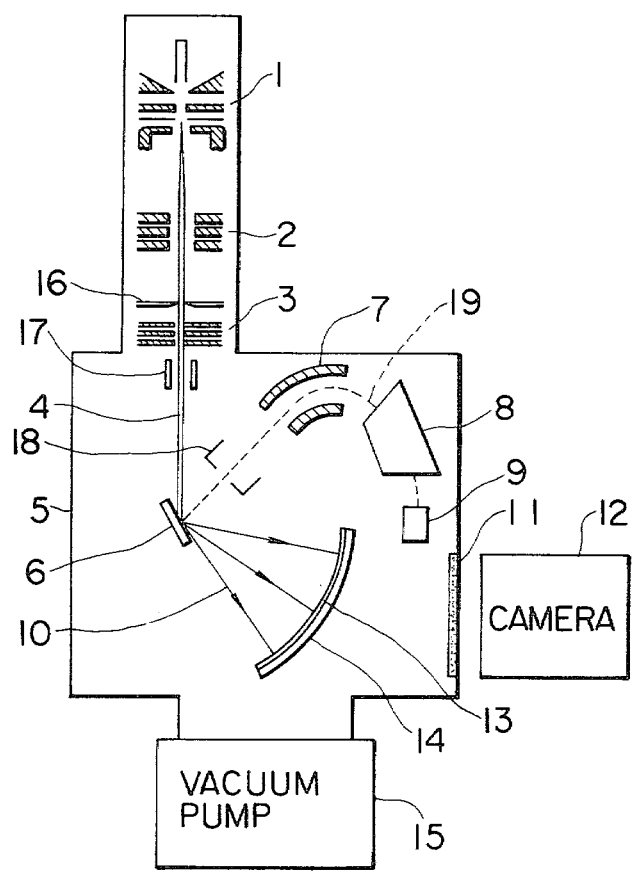

ION-ELECTRON ANALYZER

BACKGROUND OF THE INVENTION

1. Field of the Invention

The present invention relates to an ion-electron analyzer which is capable of simultaneously effecting the chemical analysis and the elemental analysis of a specimen by means of a single apparatus.

2. Description of the Prior Art

In general, in order to perform qualitative analysis or quantitative analysis of the elements constituting a specimen, or in order to analyze the binding state of the atoms and molecules of the matter thereof, it is necessary to obtain information from various angles. In recent years, particularly, there has been a demand for an apparatus which is capable of obtaining extensive information for analyzing matter, as represented, for instance, by a scanning electron microscope which offers an enlarged image of a specimen while enabling X-ray analysis to be conducted thereon.

An ion microprobe analyzer (hereinafter referred to as IMA) has so far been often used as a device for analyzing elements. In such a device, the ion beam is bombarded onto the surface of a specimen in a vacuum, and secondary ions resulting from the atoms of the specimen are detected in the form of the mass-to-charge ratio thereof using an ordinary mass spectrometer, thereby to perform elemental analysis of the specimen.

From a microscope viewpoint, however, analysis using the IMA apparatus is inherently destructive in that the bombardment of the specimen by the primary ion beam is accompanied by the development of a sputtering phenomenon on the surface of the specimen, whereby the specimen is ground down in the direction of its depth with the passage of time. Therefore, when an attempt was made to analyze the same place on the specimen from different directions, the subject portion of the specimen was already sputtered at that location making it difficult to perform the desired analysis. In other words, the analysis using the IMA apparatus was very convenient for carrying out elemental analysis of the specimen in the direction of its depth, but was undesirable from the point of view of attempting to analyze the binding state (chemical stage) of the same portion of the specimen in the direction of its depth. In this regard, in order to analyze a surface portion of a specimen, it is necessary to know what elements constitute the surface portion, as well as to know how such elements are bonded together, but such information cannot be satisfactorily obtained using a conventional IMA apparatus.

In order to analyze the binding state of elements, an analyzer based on the electron diffraction pattern has been conventionally used. With this type of analyzer, when an electron beam is bombarded onto the surface of a specimen, the electrons reflected by the specimen are received by a fluorescent screen or the like thereby to form an electron diffraction pattern, and the binding state in the specimen is analyzed based on the detected pattern information.

By alternately using the IMA apparatus and the electron diffraction analyzer, it becomes possible to carry out the desired elemental analysis of the specimen, as well to analyze the binding state with reference to the same specimen from the surface thereof in the direction of its depth. However, if the two above-mentioned analyses are performed using independent devices, the operations required to analyze the specimen become extremely cumbersome, and further, the transfer of the specimen from one analyzer to another analyzer requires very difficult positional adjustment of the specimen therein to ensure that both analyzers are performed at the same position. Moreover, the surfaces of the specimen will be brought into contact with the open air during the transfer of the specimen between devices, causing the surface state of the specimen to be changed.

SUMMARY OF THE INVENTION

Therefore, the primary object of the present invention is to provide a novel analyzer which is capable of effecting continuous elemental analysis from the surface of the specimen in the direction of its depth while detecting the change in binding state during the process of elemental analysis, by simultaneously directing an electron beam and an ion beam onto the same point of the specimen by means of the same apparatus, and analyzing the electrons reflected from the surface as well as the secondary ions.

In order to achieve the above-mentioned object, the ion-electron analyzer of the present invention comprises means for simultaneously extracting a primary electron beam and a negative primary ion beam from the same source of charged particles and bombarding them simultaneously onto a specimen in vacuum, means for forming an electron diffraction pattern utilizing the electrons reflected from the specimen as a result of the bombardment of the specimen by the primary electron beam, and means for analyzing the masses of secondary ions produced by the specimen as a result of the bombardment of the specimen by the negative primary ion beam.

Owing to the above-mentioned setup, (1) the ion beam and electron beam can be caused to bombard the same spot on the specimen, enabling elemental anslysis and state analysis to be simultaneously performed, and (2) the change in binding state from the surface in the direction of depth and the distribution of elements can be dynamically observed utilizing the erosion action of the ion beam.

BRIEF DESCRIPTION OF THE DRAWING

The accompanying drawing is a schematic diagram of an ion-electron analyzer according to the present invention.

DETAILED DESCRIPTION OF THE INVENTION

The drawing shows a fundamental setup of the ion-electron analyzer according to the present invention. The charged particle source 1 is an ion source utilizing plasma, such as a duoplasmation ion gun, which is so constructed as to simultaneously take out negative ions, such as negative oxygen ions, and an electron beam from the plasma by applying from outside a negative field as an extraction field to the plasma produced by an electric discharge taking place in a gaseous atmosphere, for example, in an atmosphere of oxygen gas. The combined negative ion and electron beam 4 are converged into fine and parallel beams through electrostatic lenses 2 and 3, and irradiated onto the surface of a specimen 6.

Deflectors 17 work to deflect the beam 4 onto any desired place on the specimen 6. In this regard, an aperture 16 allows only a paraxial beam having good parallel degree to pass therethrough. Hence, the primary ions and the primary electrons are extracted with the same extraction voltage and pass through the same electrostatic lenses 2 and 3, and therefore have the same kinetic energy. Accordingly, the focal distance determined by the electrostatic lenses 2 and 3, and the deflection distance determined by the deflector 17, have no relation to their masses, so that the primary ions and the primary electrons form a focal point at the same position and are deflected by the same distance.

Secondary ions 19 and reflected electrons 10 are emitted from the specimen 6 in response to the bombardment thereof by the combined ion beam and electron beam 4. The secondary ions 19 pass through the secondary ion extraction system 18, are separated depending upon their mass-to-charge ratios by means of a mass spectrometer made up of a sector electric field 7, a sector magnetic field 8 and a detector 9, and are analyzed for their masses. As a result, it is possible to know the kinds of elements constituting the specimen. Here, the mass spectrometer may be a double focusing mass spectrometer having the sector electric field 7 and the sector magnetic field 8, a single focusing mass spectrometer having the sector magnetic field 8 only, or a mass filter utilizing a high-frequency electric field.

The reflected electrons 10, on the other hand, are converted into a visible light by means of a fluorescent screen 14 on which is coated a fluorescent material 13, and the resulting image photographed as an electron diffraction pattern by a camera 12 through a glass window 11. The electron diffraction pattern helps determine the binding state (chemical state) of the elements constituting the specimen.

The principal portions of the apparatus are encased in a vacuum chamber 5 which is evacuated by an evacuation system 15.

Further, as required, a conventional magnetic field deflector system (not shown) may be attached to the deflector 17 such that the electron beam and ion beam are controlled in a separate manner to provide a scanning function. Therefore, in addition to simultaneously obtaining the ion beam and the electron beam, the apparatus of the present invention can be used to selectively obtain either one of them alone. Moreover, while both the ion beam and the electron beam are simultaneously irradiated onto the same place, either one of them may be neglected while the other one only is utilized.

The following is an example in which a compound segregated in a steel material is analyzed using the apparatus of the present invention.

Steels greatly owe their physical properties, such as brittleness, to the segregation of impurities. The electron beam and the ion beam were bombarded onto the surface of a micronpolished steel specimen. Analysis of secondary ions emitted from the specimen proved the segregation of manganese. Analysis of the secondary ions teaches the presence of manganese, but does not help clarify the origin of manganese, i.e., does not help determine the parent molecules of manganese. Therefore, by analyzing the electron diffraction image formed by electrons reflected by the specimen as a result of the irradiation of the electron beam, it was clarified that the origin was MnS.

Thus, by effecting the elemental analysis of the secondary ions and by analyzing the binding state based on the diffraction pattern formed by the reflected electrons, it was possible to simultaneously carry out the elemental analysis and the crystal analysis in regard to the same point. Further, by utilizing the erosion action presented by ions, it is made possible to perform the elemental analysis in the direction of depth as well as to dynamically observe the crystal structure.

The following description relates to an example in which a conductive transparent thin film of titanium oxide (TiOx) is analyzed using the apparatus of the present invention.

Conductive transparent thin films of tin oxide ($SnO_2$) have long been used widely. In this case, the substrate had to be maintained at a temperature higher than 400° C. in order to form a conductive film; there was, however, a limit in heating the substrate. To remove this defect, it was desired to develop a method of forming a conductive transparent film at normal temperature. To meet such a demand, a conductive transparent film was formed by depositing titanium onto the substrate, and exposing the substrate to an oxygen plasma in order to forcibly oxidize the surfaces. The thus-prepared thin film possessed a transparency of 90% and a surface resistivity as small as 50 ohms per square, and exhibited markedly high adhesive strength with respect to the substrate. However, the reason why the abovesaid thin film exhibited such excellent properties was not apparent.

In accordance with the present invention, the combined electron beam and ion beam were bombarded onto the surface of the specimen and the mass of the secondary ions emitted from the specimen was analyzed. It was found that the main components of the specimen were $Ti^+$ ions and $O^+$ ions with $Cu^+$, $Fe^+$ and $Cr^+$ ions being contained as impurity elements. The above results teach that at least a TiOx film has been formed on the surface of the specimen. It is not, however, clear from this analysis alone whether the formed film is TiO or $TiO_2$, and no information relating to the crystal structure of the specimen is known either. This does not help to explain the mechanism of strong adhesiveness of the film with respect to the substrate. Therefore, the diffraction pattern formed by the electrons reflected by the specimen as a result of the irradiation of the film by the electron beam together with the ion beam was analyzed. It was observed that the electron diffraction pattern consisted of a hollow pattern having small intensity and diffraction spots having strong intensity arrayed in one direction. Analysis of the pattern proved that the film consisted of fine crystals of a mixture of $TiO_2$, TiO and Ti, the $TiO_2$ being composed of rutile crystals, the a and b axes thereof being arrayed in a random fashion and the c axis thereof being erected perpendicular to the surface.

As mentioned above, since it is possible in accordance with the present invention to effect both analysis of secondary ions and analysis of electron diffraction, it is made possible to simultaneously carry out elemental analysis as well as state analysis (analysis of crystalline state) at the same location on the surface of a solid material sample. Accordingly, the overall characteristics of the surfaces of solid materials, that were so far impossible or difficult to analyze, can be clarified, presenting great industrial advantages.

While we have shown and described an embodiment of the present invention, it is understood that the same is not limited thereto but is susceptible of numerous changes and modifications as obvious to those skilled in the art, and we therefore, do not wish to be limited to the details shown and described herein but intend to cover all such changes and modifications known to those of skill in the art.

What is claimed is:

1. An ion-electron analyzer comprising means for producing a combined primary electron beam and negative primary ion beam from the same source of charged particles and for simultaneously bombarding a specimen in vacuum with said combined beam, means for forming an electron diffraction pattern utilizing electrons reflected by said specimen as a result of the bombardment of said specimen by said primary electron beam, and means for analyzing the masses of the secondary ions produced by said specimen as a result of the ion bombardment of said specimen by said negative primary ion beam.

2. An ion-electron analyzer according to claim 1, wherein said bombardment means consists of a duoplasmatron ion gun which simultaneously emits an electron beam and a negative ion beam, electrostatic lenses through which said two beams emitted from said gun are converged into fine and parallel beams, and deflector electrodes for deflecting said two beams passing through said lenses onto a selected location on said specimen.

3. An ion-electron analyzer according to claim 1, wherein said means for forming the electron diffraction pattern consists of a fluorescent screen having a surface which is coated with a fluorescent material, an evacuated housing having said beam-producing means and said specimen therein, and a glass window formed on a wall thereof at a position adjacent said fluorescent screen, and a camera positioned outside said glass window.

4. An ion-electron analyzer according to claim 1, wherein said means for analyzing the masses of said secondary ions consists of electrodes for extracting said secondary ions, a sector electric field, a sector magnetic field, and a detector.

5. An ion-electron analyzer according to claim 1, further including beam deflection means disposed along the path of said electron and ion beams for deflecting said beams with respect to said specimen.

6. An ion-electron analyzer according to claim 1, further including means for selectively deflecting said ion and electron beams so that only one of said beams irradiates said specimen.

7. An ion-electron analyzer comprising means for producing a combined primary electron beam and negative primary ion beam from the single charged particle source of duoplasmatron type, means for simultaneously bombarding a specimen with said combined beam, means for forming an electron diffraction pattern utilizing electrons reflected by said specimen as a result of the bombardment of said specimen by said primary electron beam, and means for analyzing the masses of the secondary ions produced by said specimen as a result of the ion bombardment of said specimen by said negative primary ion beam.

8. An ion-electron analyzer according to claim 7, further comprising electrostatic lenses through which said two beams emitted from said source are converged into fine and parallel beams, and deflector electrodes for deflecting said two beams passing through said lenses onto a selected location on said specimen.

9. An ion-electron analyzer according to claim 7, wherein said means for forming the electron defraction pattern consists of a fluorscent screen having a surface which is coated with a fluorescent material, an evacuated housing having said beam producing means and said specimen therein, and a glass window formed on a wall thereof at a position adjacent said fluorescent screen, and a camera positioned outside said glass window.

10. An ion-electron analyzer according to claim 7, wherein said means for analyzing the masses of said secondary ions consists of electrodes for extracting said secondary ions, a sector electric field, a sector magnetic field, and a detector.

11. An ion-electron analyzer according to claim 7, further including beam deflection means disposed along the path of said electron and ion beams for deflecting said beams with respect to said specimen.

12. An ion-electron analyzer according to claim 7, further including means for selectively deflecting said ion and electron beam so that only one of said beams irradiates said specimen.

* * * * *